US008669763B2

(12) United States Patent
Takatsuji

(10) Patent No.: US 8,669,763 B2
(45) Date of Patent: Mar. 11, 2014

(54) MULTI-AXIS FLUXGATE MAGNETIC SENSOR

(75) Inventor: Yusuke Takatsuji, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 320 days.

(21) Appl. No.: 13/047,759

(22) Filed: Mar. 14, 2011

(65) Prior Publication Data
US 2011/0241665 A1    Oct. 6, 2011

(30) Foreign Application Priority Data
Mar. 31, 2010    (JP) .................. 2010-082146

(51) Int. Cl.
G01R 33/04    (2006.01)
G01R 33/02    (2006.01)
G01R 35/00    (2006.01)
G01R 33/00    (2006.01)

(52) U.S. Cl.
USPC ............ 324/253; 342/247; 342/202; 342/225

(58) Field of Classification Search
None
See application file for complete search history.

(56) References Cited

U.S. PATENT DOCUMENTS
3,800,213 A * 3/1974 Rorden ........................ 324/247

FOREIGN PATENT DOCUMENTS
| GB | 2 319 621 | 5/1998 |
| GB | 2 438 057 | 11/2007 |
| GB | 2438057 B | 12/2009 |
| JP | S56-147086 | 11/1981 |
| JP | 2002-071773 | 3/2002 |
| JP | 2009-092381 | 4/2009 |

OTHER PUBLICATIONS

Extended European Search Report issued on Sep. 6, 2011 by the EPO for corresponding European patent application No. 11 157 908.2.
P. Brauer et al., "Transverse Field Effect in Fluxgate Sensors," Sensors and Actuators A: Physical, 1st European Magnetic Sensors and Actuators Conference, Iasi, Romania, vol. 59, Jul. 1996, pp. 70-74.
R. Estes et al., "Improvement of Azimuth Accuracy by Use of Iterative Total Field Calibration Technique and Compensation for System Environment Effects," SPE Annual Technical Conference and Exhibition, Soc of Petroleum Engineers, Oct. 1989, pp. 287-298.

* cited by examiner

*Primary Examiner* — Melissa Koval
*Assistant Examiner* — Courtney McDonnough
(74) *Attorney, Agent, or Firm* — Greenblum & Bernstein, P.L.C.

(57) ABSTRACT

A ring-shaped first ring-shaped magnetic core, a first excitation coil wound on the first ring-shaped magnetic core, two detection coils wound on the first ring-shaped magnetic core in such a manner that respective input axes of the detection coils are orthogonal to each other, two signal detection/feedback units that detect outputs of the detection coils and feed output signals back to the detection coils, and a first excitation circuit that supplies an excitation current to the first excitation coil are provided, a second ring-shaped magnetic core, a compensation coil wound on the second ring-shaped magnetic core, and a compensation signal generation unit that generates, from an output of a detection coil, a compensation current to be applied to the compensation coil, are further provided, and the second ring-shaped magnetic core and the compensation coil are disposed in positions and directions so that a compensation magnetic field created by the compensation coil cancels interference between magnetic fields generated by two detection coils wound on the first ring-shaped magnetic core.

4 Claims, 11 Drawing Sheets

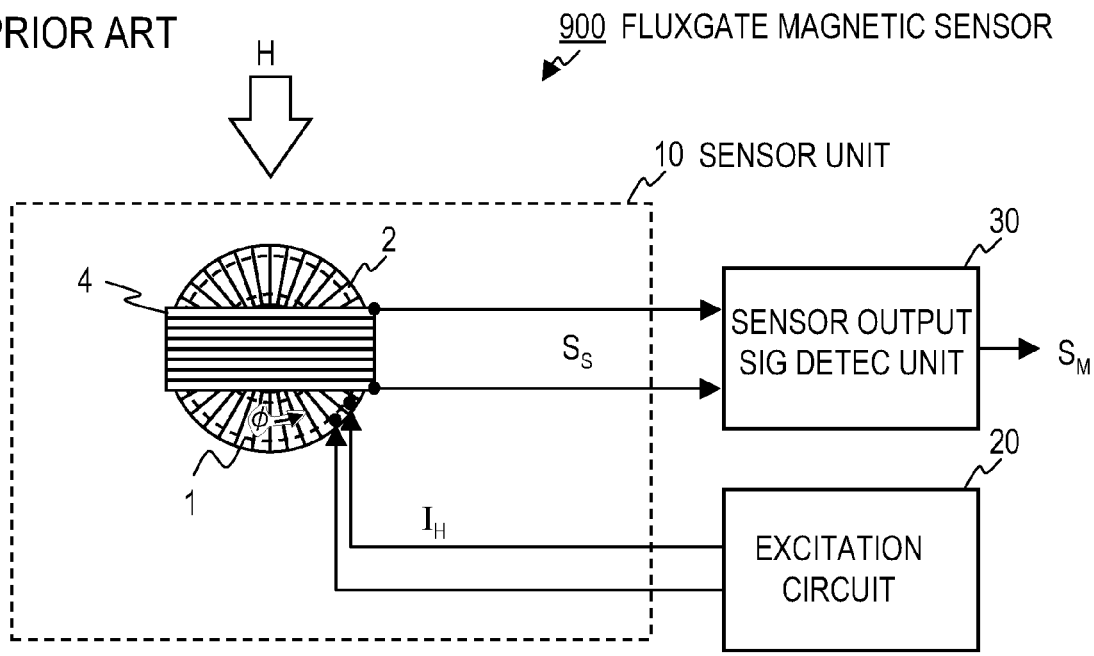
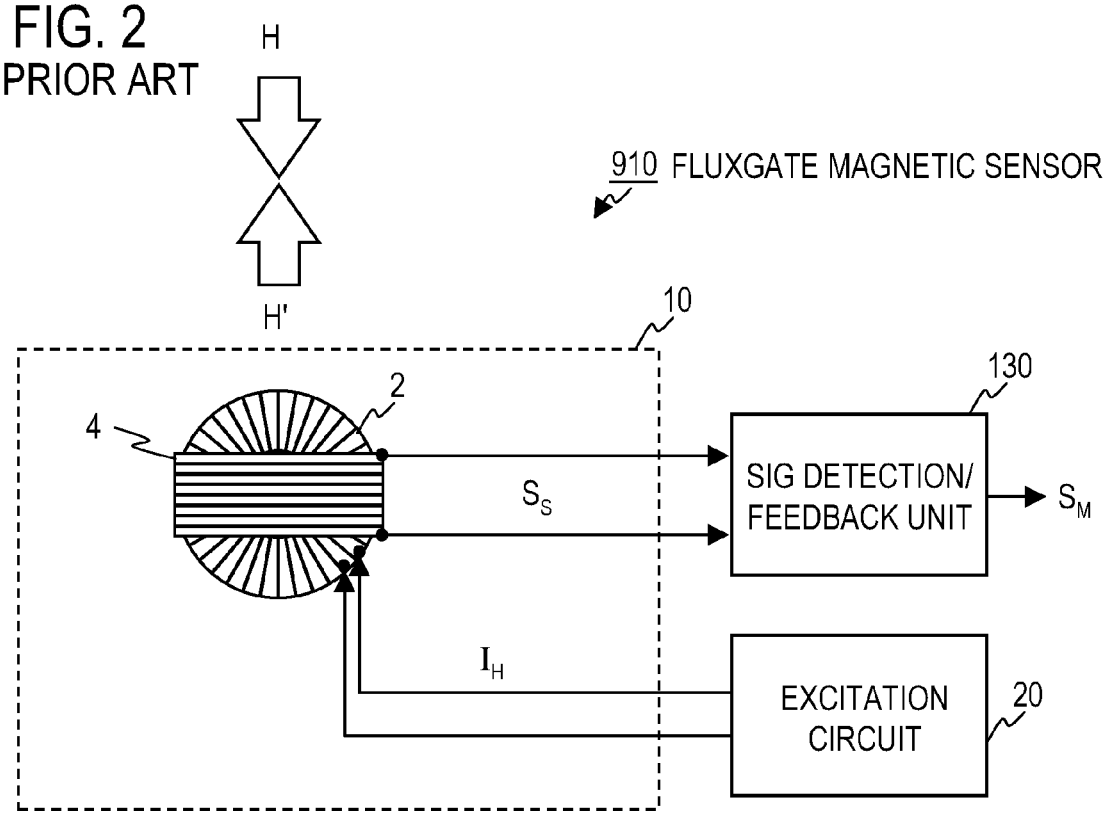

US 8,669,763 B2

MULTI-AXIS FLUXGATE MAGNETIC SENSOR

TECHNICAL FIELD

The present invention relates to a multi-axis fluxgate magnetic sensor.

BACKGROUND ART

Fluxgate Magnetic Sensor 900

First, the principle of detection by a conventional fluxgate magnetic sensor 900 will be briefly described. As illustrated in FIG. 1, a toroidal winding is provided, as an excitation coil 2, to a ring-shaped magnetic core 1 (illustrated by a dashed circular line in FIG. 1) which is made of a high magnetic permeability material such as permalloy, and a solenoidal winding is further provided to the outer side of the ring-shaped magnetic core 1 as a detection coil 4, all together constituting a sensor unit 10.

An excitation current $I_H$ with a frequency $f_0$, which has, for example, a rectangular waveform symmetrically alternating between positive and negative, is supplied to the excitation coil 2 from an excitation circuit 20. The excitation current $I_H$ causes a magnetomotive force in the excitation coil 2, and the resulting magnetic flux $\phi$ is linked with the detection coil 4. Where the value of the excitation current $I_H$ is set so as to have a magnitude sufficient to magnetically saturate the ring-shaped magnetic core 1, the ring-shaped magnetic core 1 is periodically magnetically saturated.

When the ring-shaped magnetic core 1 is excited at the frequency $f_0$, a pulse waveform with a frequency $2f_0$ is generated in the detection coil 4 as a sensor output signal $S_S$. Where an external magnetic field H such as the earth's magnetism exists, the pulse width and amplitude of the pulse waveform vary depending on the magnitude of the external magnetic field H. Accordingly, the pulse waveform with the frequency $2f_0$ is detected by means of a sensor output signal detection unit 30 as a magnetic sensor output $S_M$, enabling measurement of the external magnetic field H. The details of the operating principle are described in, e.g., Japanese Patent Application Laid-Open No. 2009-92381 (Hereinafter "Patent literature 1").

However, in this case, the amplitude of the sensor output signal $S_S$ has a linear relationship with the magnitude of the external magnetic field only when the external magnetic field is small. Accordingly, the fluxgate magnetic sensor 900 in FIG. 1 is problematic because of its poor linearity and thus narrow measurement range.

Fluxgate Magnetic Sensor 910

As art for avoiding the aforementioned problem, there is a method using a feedback magnetic field H'. A conventional one-axis closed-loop fluxgate magnetic sensor 910 will be described with reference to FIG. 2. The fluxgate magnetic sensor 910 creates a feedback magnetic field H' that is equal in absolute value but opposite in polarity to an external magnetic field H, and performs feedback control so that a magnetic field in a sensor unit 10 is consistently a zero magnetic field.

A signal detection/feedback unit 130 converts an output of the sensor unit 10 into a current, and gives feedback to a detection coil 4 using the current. As a result of the feedback current flowing in the detection coil 4, a feedback magnetic field H' having polarity opposite to that of the external magnetic field H is generated, and the feedback current increases until the absolute value of the feedback magnetic field H' becomes equal to that of the external magnetic field H. The feedback current reaches equilibrium when the magnetic field present in the detection coil becomes zero. Since this current is proportional to the external magnetic field H, the external magnetic field H can be detected by detecting the current. In such a manner as described above, a fluxgate magnetic sensor device with good linearity and thus, a wide measurement range can be provided.

Multi-Axis Fluxgate Magnetic Sensor 920

A conventional multi-axis fluxgate magnetic sensor 920 will be described with reference to FIGS. 3A and 3B. Here, a description will be given taking a three-axis one.

As with the fluxgate magnetic sensor 900, a toroidal winding is provided to a ring-shaped magnetic core (not illustrated) as an excitation coil 2-1, and a solenoidal winding is provided to the outer side of the ring-shaped magnetic core as a second detection coil 4. A solenoidal winding is further provided to the outer side of the ring-shaped magnetic core as a first detection coil 3 in such a manner that the axis is orthogonal to the second detection coil 4. The ring-shaped magnetic core, the excitation coil 2-1, the first detection coil 3 and the second detection coil 4 are included in a first/second sensor unit 110.

Furthermore, a toroidal winding is provided to a ring-shaped magnetic core (not illustrated) as an excitation coil 2-2, and a solenoidal winding is provided to the outer side of the ring-shaped magnetic core as a third detection coil 5. The ring-shaped magnetic core, the excitation coil 2-2 and the third detection coil 5 are included in a third sensor unit 210. FIGS. 3A and 3B each illustrate coordinate axes x, y and z for indicating the relationship in axis directions between the first detection coil 3, the second detection coil 4 and the third detection coil 5. The third sensor unit 210 is disposed in such a manner that an input axis (for example, the z-axis) of the third detection coil 5 is orthogonal to each of input axes (for example, the x-axis and the y-axis) of the first detection coil 3 and the second detection coil 4. In FIG. 3A, a front view of the third sensor unit 210 is illustrated, and in FIG. 3B, a plan view of the third sensor unit 210 is illustrated. The first detection coil 3 is connected to a signal detection/feedback unit 130-1, the second detection coil 4 is connected to a signal detection/feedback unit 130-2, and the third detection coil 5 is connected to a signal detection/feedback unit 130-3. The signal detection/feedback units 130-1, 130-2 and 130-3, upon receipt of sensor output signals $S_{S1}$, $S_{S2}$ and $S_{S3}$ from the first detection coil 3, the second detection coil 4 and the third detection coil 5, each create a feedback current as with the signal detection/feedback unit 130 in FIG. 2, and also create first, second and third magnetic sensor outputs $S_{M1}$, $S_{M2}$ and $S_{M3}$, respectively. The respective detection coils 3 to 5 create first to third feedback magnetic fields $H'_x$, $H'_y$ and $H'_z$ from the respective feedback currents, and perform sensing by means of a method similar to that of the fluxgate magnetic sensor 910 in FIG. 2. Thus, a three-axis fluxgate magnetic sensor with input axes orthogonal to one another is provided.

Conventionally, when a multi-axis fluxgate magnetic sensor is used to, e.g., control the orientation of an oil field drilling tool, there is a problem in that the magnetic characteristics, etc., of the ring-shaped magnetic core vary according to the temperature because of the frictional heat accompanying the drilling or, e.g., geothermal heat, causing changes in the output. Such changes in the magnetic characteristics are often non-linear with respect to the temperature, and thus, the temperature characteristic of a sensor output is inevitably non-linear with respect to the temperature. For art in which a temperature detection mechanism using a thermistor is provided in a signal processing circuit to compensate for a gain decrease in the circuit, which is caused by a temperature increase, Japanese Patent Application Laid-Open No. 2002-71773 (hereinafter "Patent literature 2") is known.

Patent literature 2 is effective for use in the case where it is only necessary to simply keep a gain of no less than a certain value, but is problematic in that it is insufficient for use in the case where the linearity of the temperature characteristic curve is required.

Furthermore, while when multiple axes are employed in a ring-shaped magnetic core-equipped fluxgate magnetic sensor, detection coils must be arranged so that the axes of the coils are orthogonal to each other, it is known that the two orthogonal axes cause interference, resulting from the heterogeneity of the material of the ring-shaped magnetic cores and in addition, the interference amount has temperature dependency (Reference literature 1: P. Brauer, J. M. G. Merayo, O. V. Nielsen, F. Primdahl and J. R. Petersen, "Transverse field effect in fluxgate sensors", Sensors and Actuators A: Physical, 1997, vol. 59, Volume 59, p.p. 70-74).

Accordingly, the conventional multi-axis fluxgate magnetic sensor 920 has a problem in that interference $IF_{AX}$ occurs between orthogonal feedback magnetic fields (for example, between the first feedback magnetic field $H'_x$ and the second feedback magnetic field $H'_y$), disabling accurate sensing.

Although measuring the interference amount in advance and performing compensation can be considered, the interference amount has temperature dependency, and the temperature dependency is non-linear with respect to the changes in the temperature. Thus, the interference amount cannot easily be compensated for. If the change in the interference amount with respect to the temperature is substantially linear, the interference amount can easily be compensated for; however, if the change in the interference amount with respect to the temperature is non-linear and compensation is performed using a polynomial approximation, although it is desirable that the order of the compensation formula be high, the order of the compensation formula is ordinarily restricted because of the limits of the compensation system. If an order that is high enough to respond to non-linear change in data cannot be attained, the compensation residual increases, disabling provision of a sensor sufficient for practical use.

Here, a brief description is provided below with regard to an interference amount having temperature dependency and the temperature dependency being non-linear with respect to the changes in the temperature (see Reference literature 1). First, magnetic flux $\Phi_d$ in each detection coil can be expressed by the following expression:

$$\Phi_d = L_{d0}(t) \times i_d(t) + \mu_0 A_{core} \times \int_0^{2\pi} \sum_{n=1}^{N_d} h_t^1(n, \theta) \times M(t, \theta) \times d \times d\theta$$

Here, $\Phi_d$ denotes the entire magnetic flux in the coil, $L_{d0}(t)$ denotes a self-inductance of the detection coil (where no magnetic core is provided), $i_d(t)$ denotes the detection current, $\mu_0$ denotes a magnetic permeability of a ring-shaped magnetic core, $A_{core}$ denotes a cross-sectional area of the ring-shaped magnetic core, d is a diameter of the ring-shaped magnetic core, $\theta$ denotes an angle expressed as a rotational position of the ring-shaped magnetic core, $M(t, \theta)$ denotes magnetization in the tangential direction of the ring-shaped magnetic core, $h_t^1(n, \theta)$ denotes a component in tangential direction of a magnetic field in the ring-shaped magnetic core (which is generated by a n-th detection winding) and $N_d$ denotes the number of turns of the detection coil.

Here, the magnetization $M(t, \theta)$ in the tangential direction of the ring-shaped magnetic core is proportional to a magnetic susceptibility $\chi(\theta)$ and inversely proportional to the square of saturated magnetization $M_s$ (see Reference literature 1). The magnetic susceptibility $\chi(\theta)$ is an amount depending on a component in the rotational direction of the ring-shaped magnetic core, which causes the interference between the orthogonal axes. Also, it is known that saturated magnetization $M_s$ generally decreases with a temperature increase, and it has a non-linear characteristic. Accordingly, the magnetization $M(t,\theta)$ is a function between the magnetic susceptibility $\chi(\theta)$ and the temperature, and the amount of the interference between the orthogonal axes non-linearly varies according to the temperature. Because of the non-linearity of the interference amount, it is difficult to compensate for the interference amount, disabling accurate sensing.

For example, the temperature characteristic of the sensor sensitivity of the conventional multi-axis fluxgate magnetic sensor 920 exhibits a temperature coefficient that rapidly increases upon reaching a certain temperature, as indicated by a solid line in FIG. 4. It is presumed that this is attributable to the material, etc., of the ring-shaped magnetic core having a non-linear temperature coefficient, which affects the amount of interference between the orthogonal axes. The details of the measurement method in FIG. 4 will be described later.

SUMMARY OF THE INVENTION

In order to solve the aforementioned problems, a multi-axis fluxgate magnetic sensor according to the present invention comprises: a ring-shaped first ring-shaped magnetic core; a first excitation coil wound on the first ring-shaped magnetic core; first and second detection coils wound on the first ring-shaped magnetic core in such a manner that respective input axes of the first and second detection coils are orthogonal to each other; first and second signal detection/feedback units that detect outputs of the first and second detection coils and feed output signals back to the first and second detection coils; a first excitation circuit that supplies an excitation current to the first excitation coil; a second ring-shaped magnetic core; a compensation coil wound on the second ring-shaped magnetic core; and a compensation signal generation unit that generates a compensation current to be applied to the compensation coil, from at least one of the outputs of the first and second detection coils, wherein the second ring-shaped magnetic core and the compensation coil are disposed so that a compensation magnetic field created by the compensation coil cancels interference between the first and second detection coils wound on the first ring-shaped magnetic core.

EFFECTS OF THE INVENTION

The present invention exerts an effect in that a compensation current is applied to a compensation coil to generate a compensation magnetic field, thereby balancing out interference between orthogonal axes to each other, enabling accurate sensing irrespective of changes in the temperature.

BRIEF DESCRIPTION OF THE DRAWINGS

FIG. 1 is a diagram illustrating an example configuration of a conventional fluxgate magnetic sensor 900;

FIG. 2 is a diagram illustrating an example configuration of a conventional fluxgate magnetic sensor 910 using a feedback magnetic field;

DETAILED DESCRIPTION OF THE EMBODIMENTS

Hereinafter, embodiments of the present invention will be described in detail.

Embodiment

Multi-Axis Fluxgate Magnetic Sensor 100

A multi-axis fluxgate magnetic sensor 100 according to an embodiment will be described with reference to FIGS. 5 to 10. The multi-axis fluxgate magnetic sensor 100 includes a first/second sensor unit 110, a third sensor unit 310, signal detection/feedback units 130-1 to 130-3, excitation circuits 120-1 to 120-2 and a compensation signal generation unit 61.

First/Second Sensor Unit 110

Figure 6A:
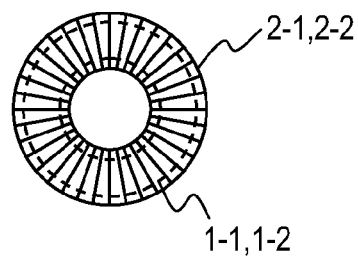
FIG. 6A is a plan view of a ring-shaped magnetic core 1 and an excitation coil 2.
Figure 6B:
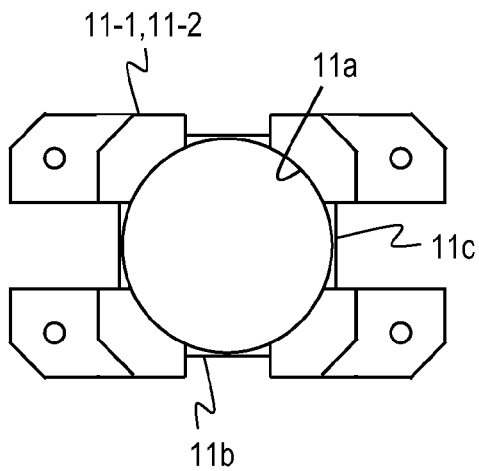
FIG. 6B is a bottom view of a coil securing frame 11.
Figure 7A:
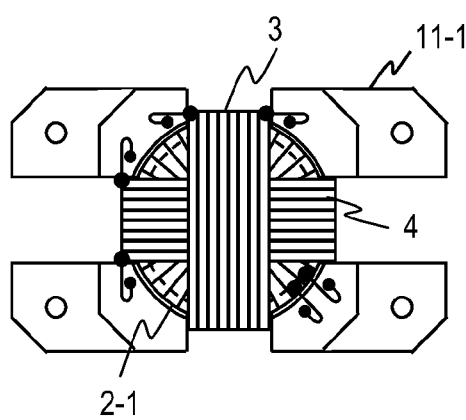
FIG. 7A is a bottom view of a first/second sensor unit 110.

The first/second sensor unit 110 will be described with reference to FIGS. 6A, 6B and FIGS. 7A, 7B and 7C. A toroidal winding is provided as an excitation coil 2-1 to a ring-shaped magnetic core 1-1 indicated by dashed lines in FIG. 6A which is made of a high magnetic permeability material such as permalloy. A first detection coil and a second detection coil, respective axes of which are orthogonal to each other, are further wound around the ring-shaped magnetic core. In the embodiment in FIG. 6A, the ring-shaped magnetic core 1-1, around which the excitation coil 2-1 is wound, is fitted in an excitation coil fitting recess 11a of a coil securing frame 11-1, which is illustrated in FIG. 6B, and a second detection coil 4 and a first detection coil 3, respective axes of which are orthogonal to each other, are wound around the excitation coil 2-1 over the excitation coil securing frame 11-1, as illustrated in FIG. 7A.

Figure 7C:
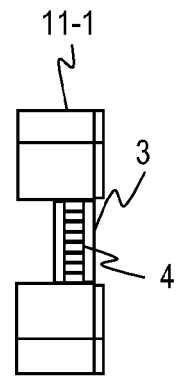
FIG. 7C is a right-side view of a first/second sensor unit 110.
Figure 7B:
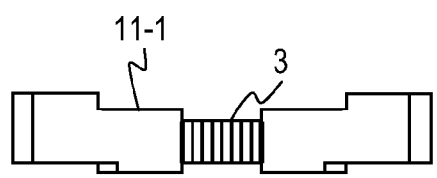
FIG. 7B is a front view of a first/second sensor unit 110.

More specifically, the coil securing frame 11-1 is a substantially rectangular block molded from a resin, and slots 11b for a first detection coil (hereinafter referred to as first detection coil slots) and slots 11c for a second detection coil (hereinafter referred to as second detection coil slots) are formed at respective centers of two sets of opposite sides of the rectangular block, and the round excitation coil fitting recess 11a is formed at a center of a top surface. The excitation coil 2-1 is fitted into the excitation coil fitting recess 11a of the coil securing frame 11-1 in FIG. 6B. A solenoidal winding is further wound around the ring-shaped magnetic core 1-1 in the second detection coil slots 11c as the second detection coil 4 (see FIG. 7A). A solenoidal winding is further wound around the ring-shaped magnetic core in the first detection coil slots 11b as the first detection coil 3 in such a manner that it is orthogonal to the second detection coil 4. As a result of winding the first detection coil 3 and the second detection coil 4 around the ring-shaped magnetic core 1-1 as described above, input axes of the detection coils are made to be orthogonal to each other. The ring-shaped magnetic core 1-1, the excitation coil 2-1, the coil securing frame 11-1, the first detection coil 3 and the second detection coil 4, together, constitute the first/second sensor unit 110. FIGS. 7A, 7B and 7C illustrate a bottom view, a right-side view and a front view of the sensor unit, respectively.

Third Sensor Unit 310

Figure 8:
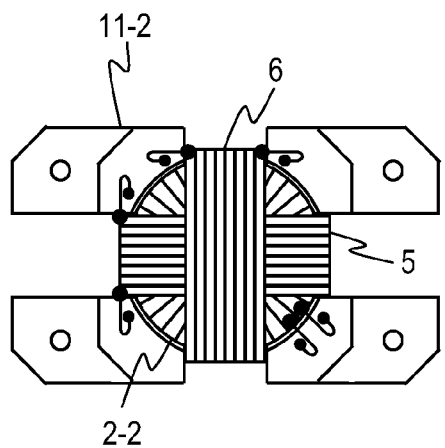
FIG. 8 is a bottom view of a third sensor unit 310.

The third sensor unit 310 will be described with reference to FIG. 8. As illustrated in FIG. 6A, a toroidal winding is provided as an excitation coil 2-2 to a ring-shaped magnetic core 1-2 which is similar to the ring-shaped magnetic core 1-1.

The excitation coil 2-2 is fitted in an excitation coil fitting recess 11a of a coil securing frame 11-2 in FIG. 6B. A solenoidal winding is wound as a third detection coil 5 around the ring-shaped magnetic core in the slots 11c. A solenoidal winding is further wound as a compensation coil 6 around the ring-shaped magnetic core in the slots 11b in such a manner that it is orthogonal to the third detection coil 5. As a result of winding the third detection coil 5 and the compensation coil 6 on the ring-shaped magnetic core 1-2 as described above, respective input axes of the third detection coil 5 and the compensation coil 6 are made to be orthogonal to each other. The ring-shaped magnetic core 1-2, the excitation coil 2-2, the coil securing frame 11-2, the third detection coil 5 and the compensation coil 6 constitute the third sensor unit 310.

Figure 9:
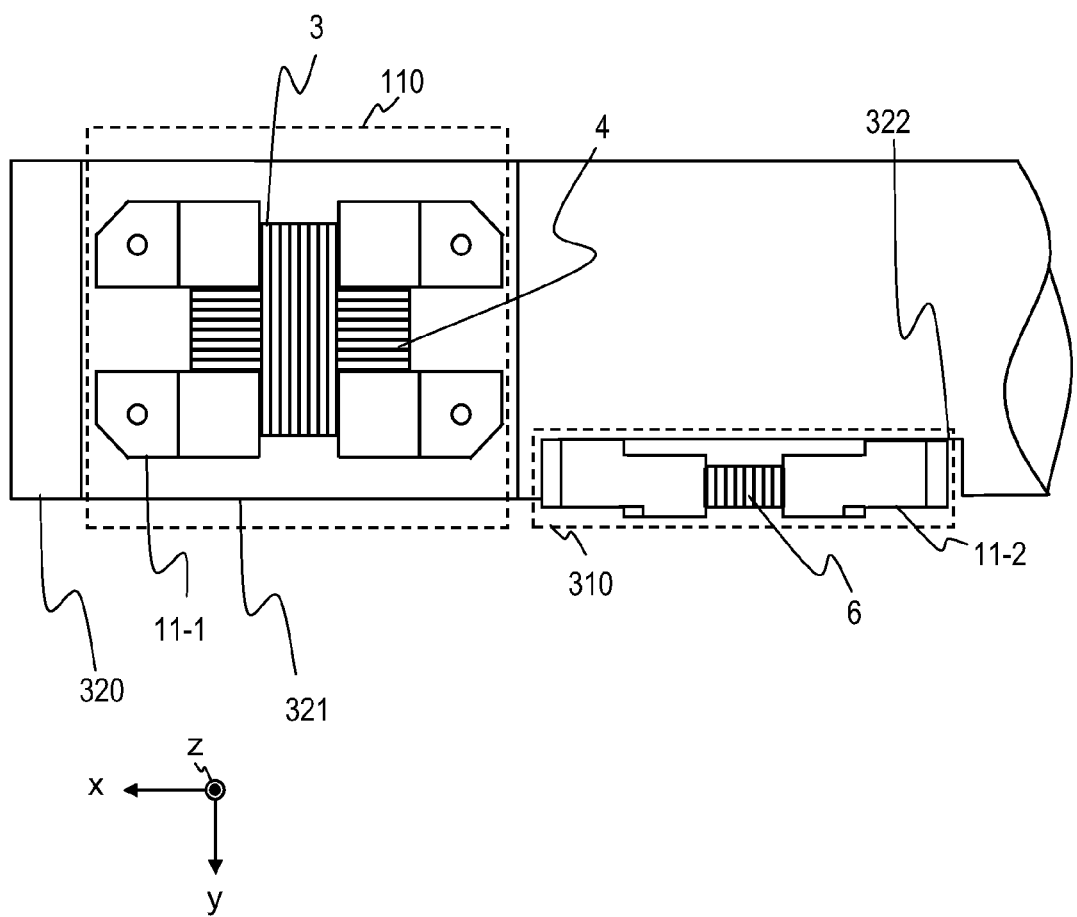
FIG. 9 is a plan view of a first/second sensor unit 110 and a back view of a third sensor unit 310 in a multi-axis fluxgate magnetic sensor 100.
Figure 10:
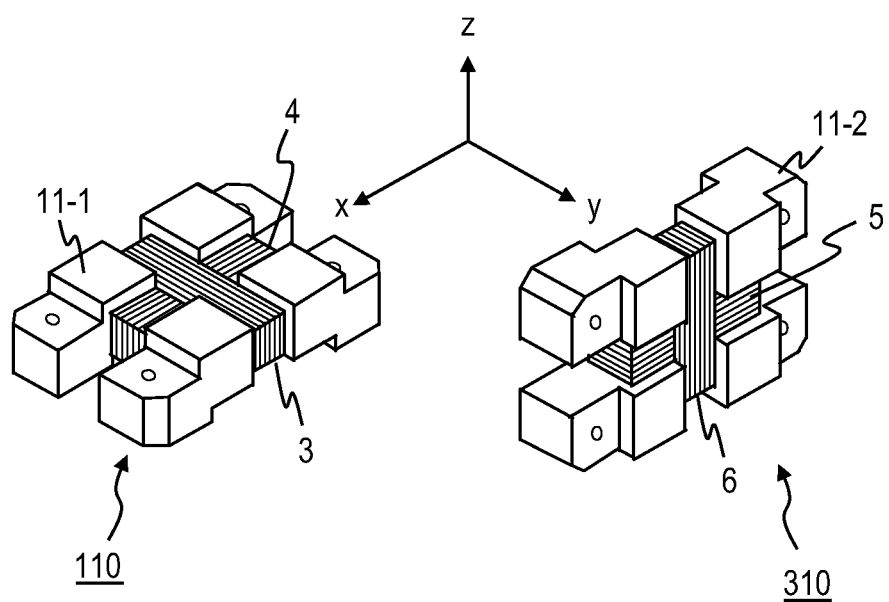
FIG. 10 is a perspective view illustrating a positional relationship between a first/second sensor unit 110 and a third sensor unit 310 in a multi-axis fluxgate magnetic sensor 100.

As illustrated in FIG. 9, in the peripheral surface of a cylindrical shaft 320, which is made of a non-magnetic material, two cutout recesses 321 and 322 are formed. The cutout recesses 321 and 322 have bottom planes which are orthogonal to each other and parallel to the axis of the shaft. The first/second sensor unit 110 is disposed in the cutout recess 321, and the third sensor unit 310 is disposed in the cutout recess 322. In FIG. 9, a back view of the third sensor unit 310 is illustrated. FIG. 10 illustrates the positional relationship between the first/second sensor unit 110 and the third sensor unit 310 by means of a perspective diagram. Here, the first/second sensor unit 110 and the third sensor unit 310 in FIG. 9 are illustrated with a clockwise rotation of 90° relative to the center axis (x-axis direction) of the shaft 320. As illustrated in FIGS. 9 and 10, the input axis of the third detection coil 5 is arranged so as to be orthogonal to the respective input axes of the first detection coil 3 and the second detection coil 4, enabling configuration of a three-axis fluxgate magnetic sensor.

Excitation Circuits 120-1 and 120-2

Referring back to FIG. 5, the excitation circuit 120-1 is connected to the excitation coil 2-1, the excitation circuit 120-2 is connected to the excitation coil 2-2, and an excitation current symmetrically alternating between positive and negative is supplied to the excitation coil 2-1 and the excitation coil 2-2. Although in FIG. 5, the excitation circuits 120-1 and 120-2 are respectively provided to the excitation coils 2-1 and 2-2, the excitation circuits 120-1 and 120-2 may be a common excitation circuit.

Signal Detection/Feedback Units 130-1, 130-2 and 130-3

The first detection coil 3 is connected to the signal detection/feedback unit 130-1, the second detection coil 4 is connected to the signal detection/feedback unit 130-2, and the third detection coil 5 is connected to the signal detection/feedback unit 130-3, and the detection coils 3, 4 and 5 provide sensor output signals $S_{S1}$, $S_{S2}$ and $S_{S3}$ to the signal detection/feedback units 130-1, 130-2 and 130-3, respectively.

The signal detection/feedback units 130-1 to 130-3 respectively detect the sensor output signals from the detection coils 3 to 5 and output first, second and third magnetic sensor output signals $S_{M1}$, $S_{M2}$ and $S_{M3}$, and provide feedback currents corresponding to the magnetic sensor output signals to the respective detection coils. The respective detection coils 3, 4 and 5 create first, second and third feedback magnetic fields $H'_x$, $H'_y$ and $H'_z$ from the feedback currents, and perform sensing by means of a method similar to that of the fluxgate magnetic sensor 910 in FIG. 2. In other words, the signal detection/feedback units 130-1, 130-2 and 130-3 detect an external magnetic field by means of their respective feedback currents.

Compensation Signal Generation Unit 61

The compensation signal generation unit 61 generates a compensation current to be applied to the compensation coil 6, from at least one of outputs of the first detection coil 3 and the second detection coil 4. For example, in the present embodiment, a compensation current to be applied to the compensation coil 6 is generated from an output of the second detection coil 4. A description will be given with reference to FIG. 11. The compensation signal generation unit 61 includes a buffer amplifier 62-2 and a resistor 65. The output $S_{S2}$ of the second detection coil 4 is input to the buffer amplifier 62-2. A gain of the buffer amplifier 62-2 is set by means of a gain adjustment terminal 63-2. An end of the compensation coil 6 is connected to an output of the buffer amplifier 62-2 via the resistor 65, and the other end is connected to a signal ground 66. Upon an output of the buffer amplifier 62-2 being applied to the compensation coil 6, the compensation coil 6 creates a compensation magnetic field $H'_w$. A method for calculating the magnitude of the gain set by means of the gain adjustment terminal 63-2 will be described later.

Disposition of the Compensation Coil

Figure 12:
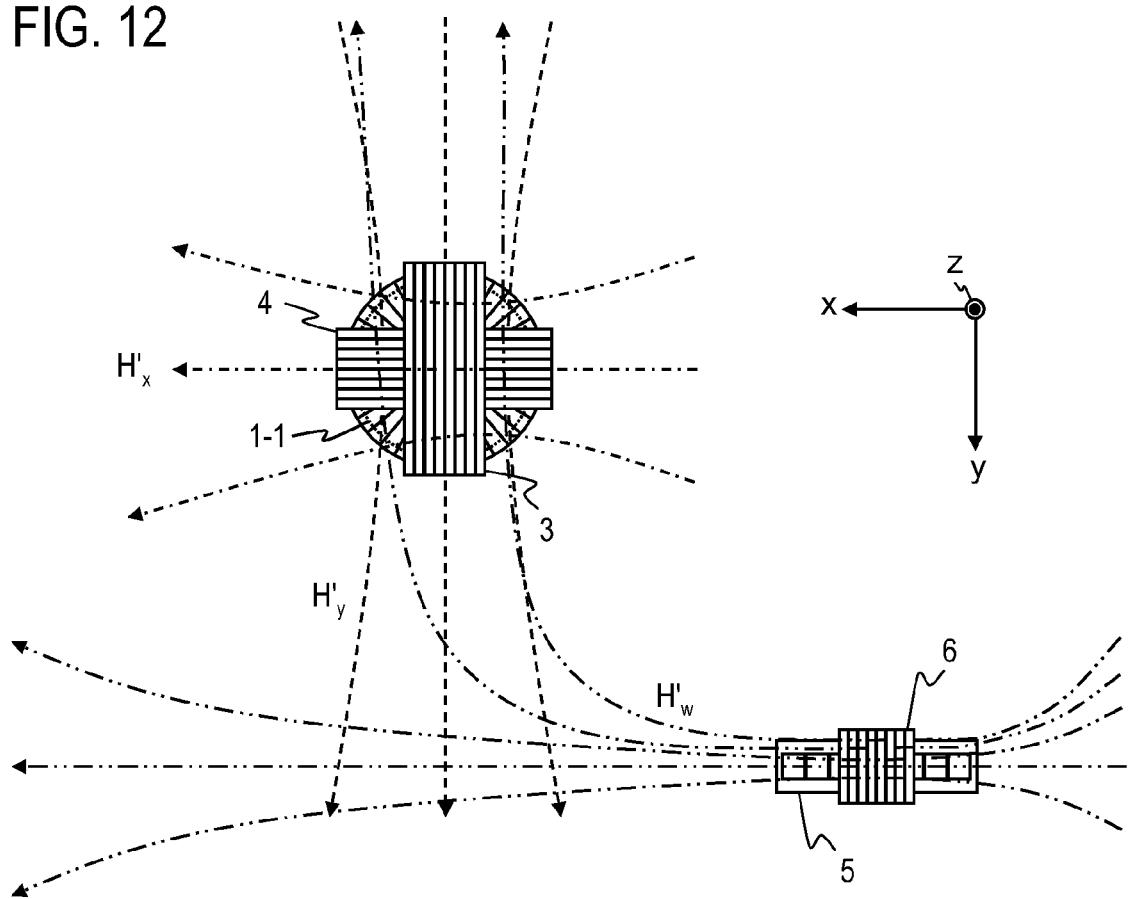
FIG. 12 is a diagram illustrating the principle of a multi-axis fluxgate magnetic sensor 100 according to the embodiment.

As illustrated in FIG. 12, for example, the first and second detection coils 3, 4 and the compensation coil 6 are disposed in positions and directions enabling the compensation magnetic field $H'_w$ created by the compensation coil 6 to cancel (balance out) interference occurring between the feedback magnetic fields $H'_x$ and $H'_y$ generated by the first detection coil 3 and the second detection coil 4 wound on the ring-shaped magnetic core 1-1. For example, as in FIGS. 9 and 10, the compensation coil 6 and the first and second detection coils 3 and 4 are disposed in such a manner that they are shifted from each other in the x-axis direction. In the present embodiment, the distance between the centers of the ring-shaped magnetic cores is approximately 35 mm. For example, where the compensation coil 6 and the second detection coil 4 are disposed so that the direction of the compensation magnetic field $H'_w$ created by the compensation coil 6 is substantially opposite to the direction of the feedback magnetic field $H'_y$ created by the second detection coil 4, and the amount of compensation current applied to the compensation coil 6 is adjusted according to the output of the second detection coil 4, the compensation magnetic field $H'_w$ created by the compensation coil 6 acts so as to balance out mutual interference between orthogonal feedback magnetic fields, enhancing the linearity of the magnetic detection sensitivity of the first detection coil 3.

Adjustment of Compensation Magnetic Fields

Since an optimum value of a compensation magnetic field varies depending on, e.g., the distance and/or positional relationship between, and/or directions of, the detection coils 3 and 4, which cause interference, and the compensation coil 6, e.g., the distance and/or positional relationship between, and/or directions of, the second detection coil 4 and the compensation coil 6 are made to be adjustable within the cutout recesses 321 and 322.

Figure 13:
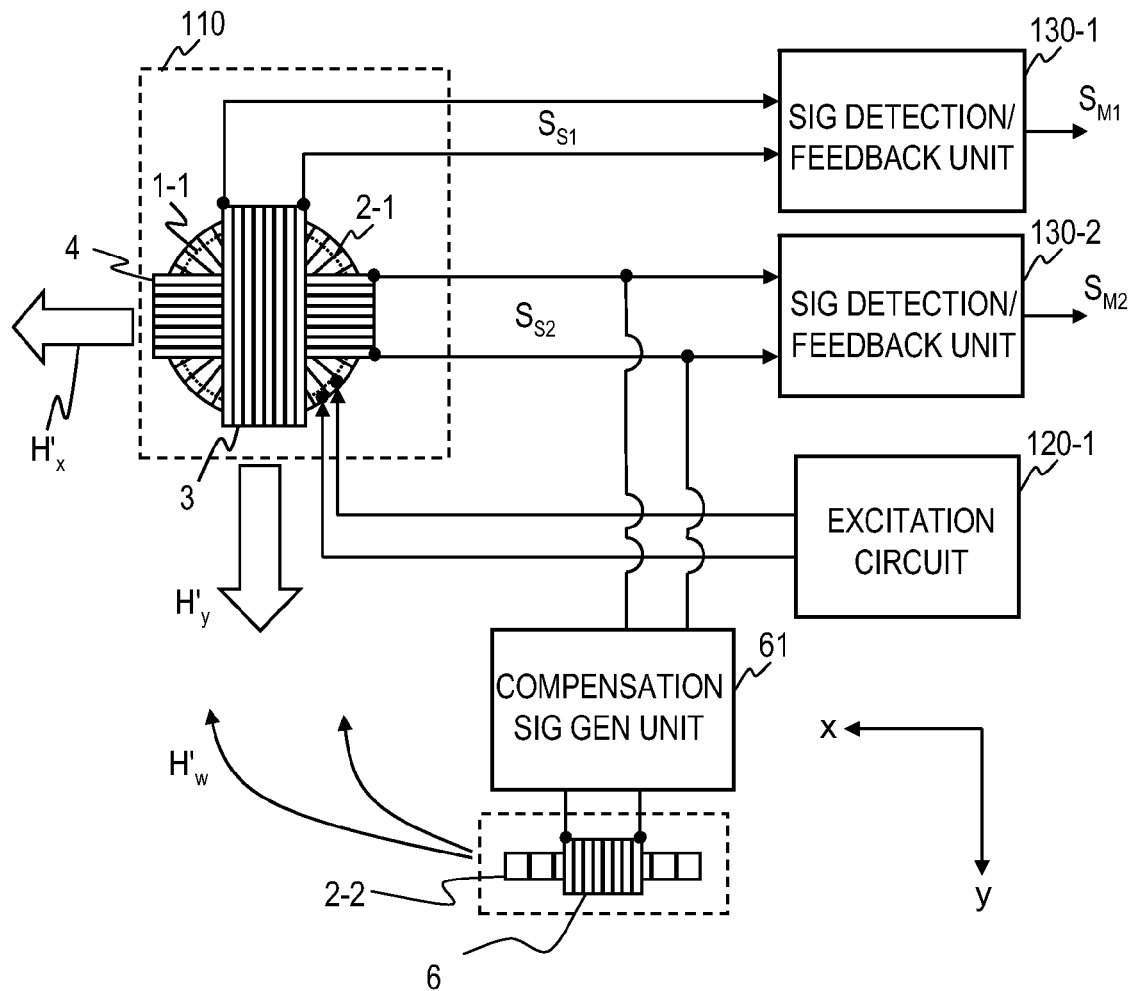
FIG. 13 is a diagram illustrating a method for adjusting a compensation magnetic field based on an output of one detection coil.

For example, a two-axis fluxgate magnetic sensor is configured as illustrated in FIG. 13, changes in the magnetic sensor sensitivity of the first detection coil 3 are monitored while applying temperatures to the two-axis fluxgate magnetic sensor and generating a compensation magnetic field using the output of the second detection coil 4, and the gain of the buffer amplifier 62-2, the distance and/or positional relationship between, and/or directions of, detection coils, which cause interference to be balanced out, and the compensation coil 6, and/or the number of turns of the compensation coil 6 are adjusted so that the non-linearity of the temperature characteristic curve is minimum. By means of the adjustment, the gain, etc., are determined in advance, and in actual use, the magnitude of the compensation current is determined using at least one of the outputs of the two detection coils, thereby adjusting the compensation magnetic field.

Effects

Figure 3A:
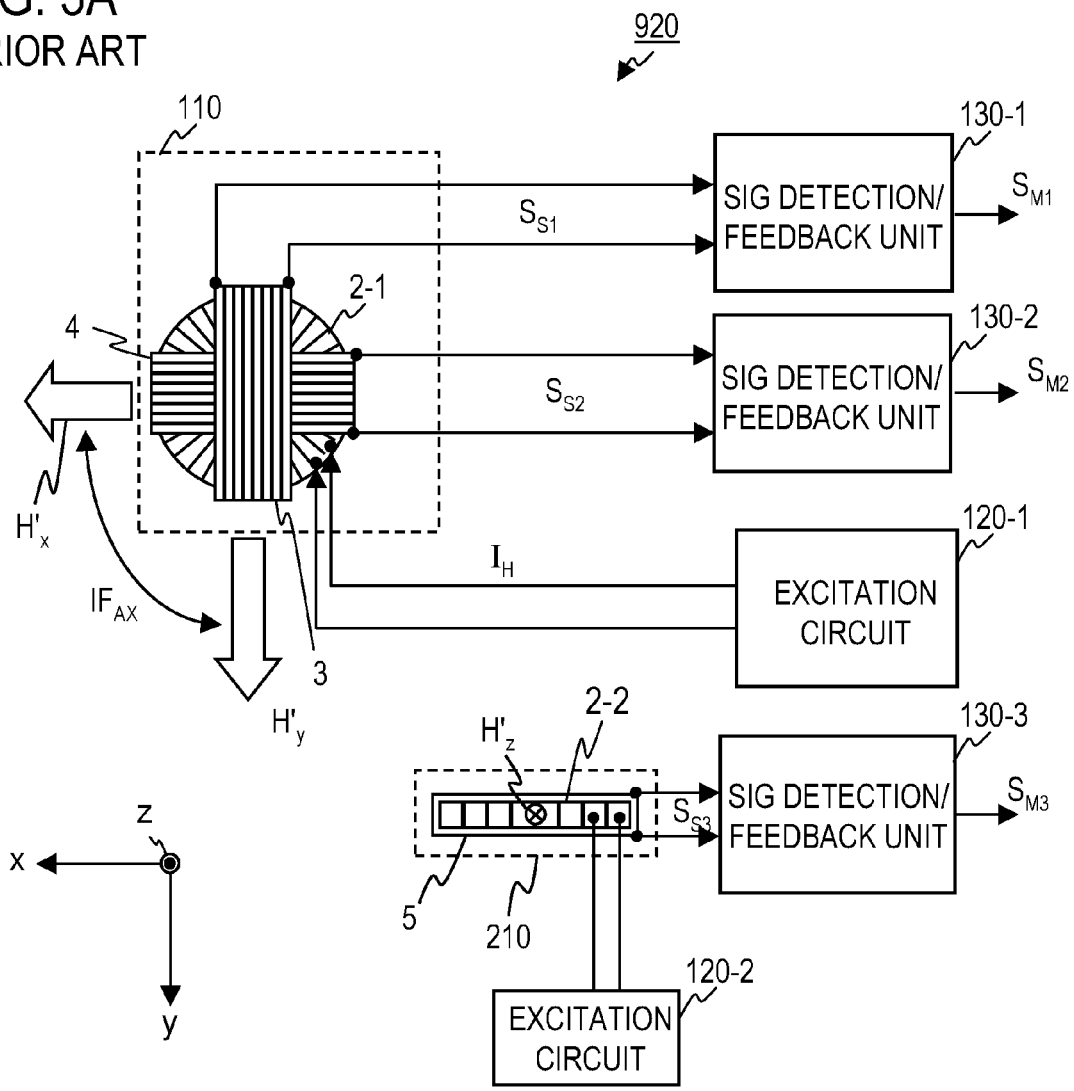
FIG. 3A is a diagram illustrating an example configuration of a conventional fluxgate magnetic sensor 920 using feedback magnetic fields and having multiple axes.
Figure 3B:
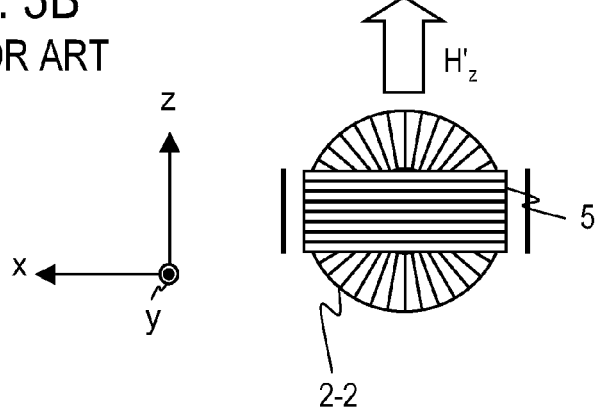
FIG. 3B is a plan view of a third sensor unit 210.
Figure 4:
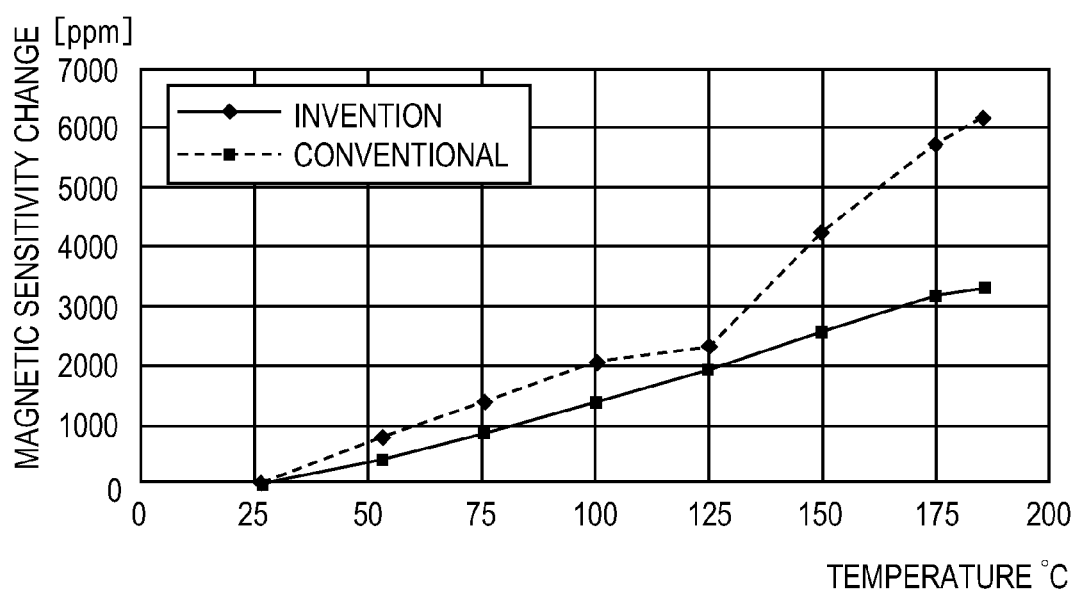
FIG. 4 is a diagram illustrating a relationship between amount of change in magnetic sensitivity and temperature in each of a conventional multi-axis fluxgate magnetic sensor 920 and a multi-axis fluxgate magnetic sensor 100 according to the embodiment.
Figure 5:
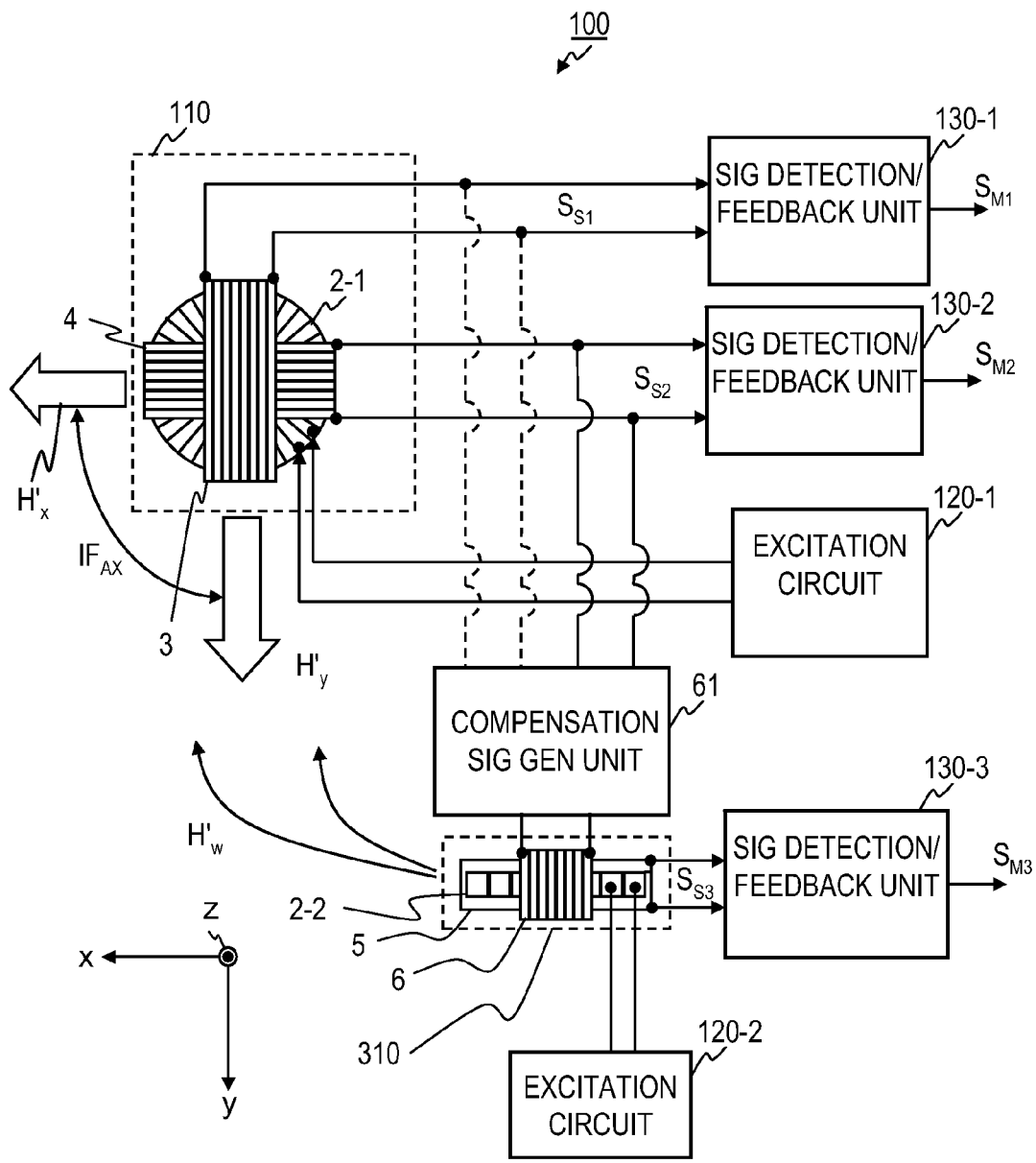
FIG. 5 is a diagram illustrating an example configuration of a multi-axis fluxgate magnetic sensor 100 according to the embodiment.

With the configuration as described above, interference between two orthogonal axes is suppressed, and as a result, amount of change in the magnetic sensitivity becomes substantially linear with respect to the temperature as indicated by the dashed line in FIG. 4. Consequently, the amount of change in the magnetic sensitivity can easily be compensated for, enabling accurate sensing. The present embodiment is applicable also to a multi-axis fluxgate magnetic sensor used in a high-temperature environment.

FIG. 4 illustrates the relationships between the amount of change in the magnetic sensitivity and the temperature in the multi-axis fluxgate magnetic sensor 100 according to the present invention and the conventional multi-axis fluxgate magnetic sensor 920, which are indicated by a solid line and a dashed line, respectively. The turn counts of the respective detection coils 3 to 5 and compensation coil are all the same, the distance between the detection coils 3 and 4, and the compensation coil 6 is approximately 35 mm in the direction of the x-axis, and an input axis of the compensation coil 6 is parallel to the x-axis, an output of the second detection coil 4 is an input of the compensation signal generation unit 61, an output of the compensation signal generation unit 61 is supplied to the compensation coil 6, and the compensation coil 6 creates a compensation magnetic field $H'_w$.

A process for obtaining data in FIG. 4 is described below. In step 1, the orientation of the two-axis fluxgate magnetic sensor is set so that the x-axis is orthogonal to the earth's magnetism. In step 2, output voltages of the second detection coil 4 and the third detection coil 5 are measured at every 45°, i.e., at each of eight equi-angular points along one rotation with reference to the depression of the earth's magnetism. Since the data has been obtained when the sensor is rotated around the input axis (x-axis) of the first detection coil 3, it should be understood that the output voltage of the first detection coil 3 is substantially zero. Also, the depression of the earth's magnetism varies depending to the area in which the measurement is made. In step 3, the orientation of the fluxgate magnetic sensor is set so that the y-axis is orthogonal to the earth's magnetism, and with a process similar to step 2, the output voltages of the first detection coil 3 and the third detection coil 5 are measured. In step 4, the orientation of the fluxgate magnetic sensor is set so that the z-axis is orthogonal to the earth's magnetism, and with a process similar to step 2, the output voltages of the first detection coil 3 and the second detection coil 4 are measured. However, the order of measurement axes in steps 2 to 4 is not necessarily the order of the x-axis, the y-axis and the z-axis. According to the data measured as described above, characteristic values (bias, sensitivity and misalignment) of a geomagnetic sensor are calculated using an "iterative total field calibration technique" (see Reference literature 2).

[Reference literature 2] R. Estes, P. Walters, "Improvement of Azimuth Accuracy by Use of Iterative Total Field Calibration Technique and Compensation for System Environment Effects", SPE Annual Technical Conference and Exhibition, Society of Petroleum Engineers, 1989, SPE 19546, p.p. 287-298

Steps 1 to 4 are performed for each temperature, and the sensor characteristic values are calculated for the respective temperatures, and the magnetic sensor sensitivities obtained based on the output of the first detection coil by means of the "iterative total field calibration technique" are plotted, whereby the temperature characteristic curve in FIG. 4 has been obtained.

In the present embodiment, the ring-shaped magnetic cores 1-1 and 1-2 have the same configuration, enabling enhancement of production efficiency. Furthermore, the excitation coils 2-1 and 2-2 have a same configuration, and/or the coil securing frames 11-1 and 11-2 have a same configuration, enabling an effect similar to the above. Furthermore, the configurations of all the detection coils 3, 4 and 5 are made to be the same, enabling enhancement of production efficiency. In the present embodiment, the coil wound on the same ring-shaped magnetic core as that of the third detection coil 5 and orthogonal to the third detection coil 5 is used as the compensation coil 6 in the multi-axis fluxgate magnetic sensor 920, enabling accurate sensing without addition of, e.g., new parts other than the compensation coil 6 and the compensation signal generation unit 61.

[Modifications]

Figure 14:
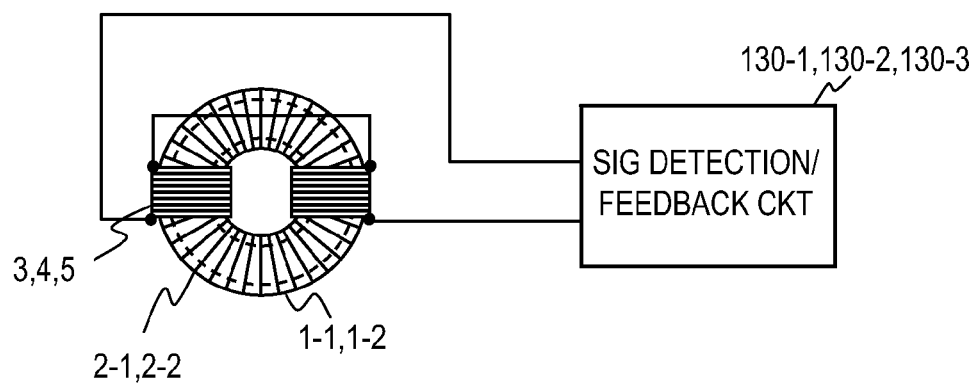
FIG. 14 is a diagram illustrating an example configuration where a winding is provided to a part of a periphery of a ring-shaped magnetic core as a detection coil.

For the detection coils 3 to 5, their input axes only need to be orthogonal to one another, and thus, a detection coil may be provided in two parts on radially opposite two portions of a ring-shaped magnetic core as illustrated in FIG. 14, rather than in a unitary part diametrically across the ring-shaped magnetic core.

Also, the shape of each ring-shaped magnetic core only needs to be one that allows relevant detection coils or compensation coil to be wound thereon. Accordingly, the shape (ring shape) of each ring-shaped magnetic core is not limited to a circular ring shape, which is illustrated in the embodiment, and may be, e.g., a rectangular ring shape, a polygonal ring shape or an oval ring shape.

Furthermore, although in the present embodiment, three detection coil input axes are provided, two detection coil input axes may be provided.

Furthermore, although in the present embodiment, the input axis of the compensation coil 6 is arranged so as to be parallel to the input axis of the first detection coil 3, which is one of the detection coils causing interference to be balanced out, the interference being caused between their orthogonal axes, and orthogonal to the input axis of the second detection coil 4, which is the other coil, the input axis of the compensation coil 6 only needs to be arranged in a position and direction enabling cancellation of the interference.

Figure 15:
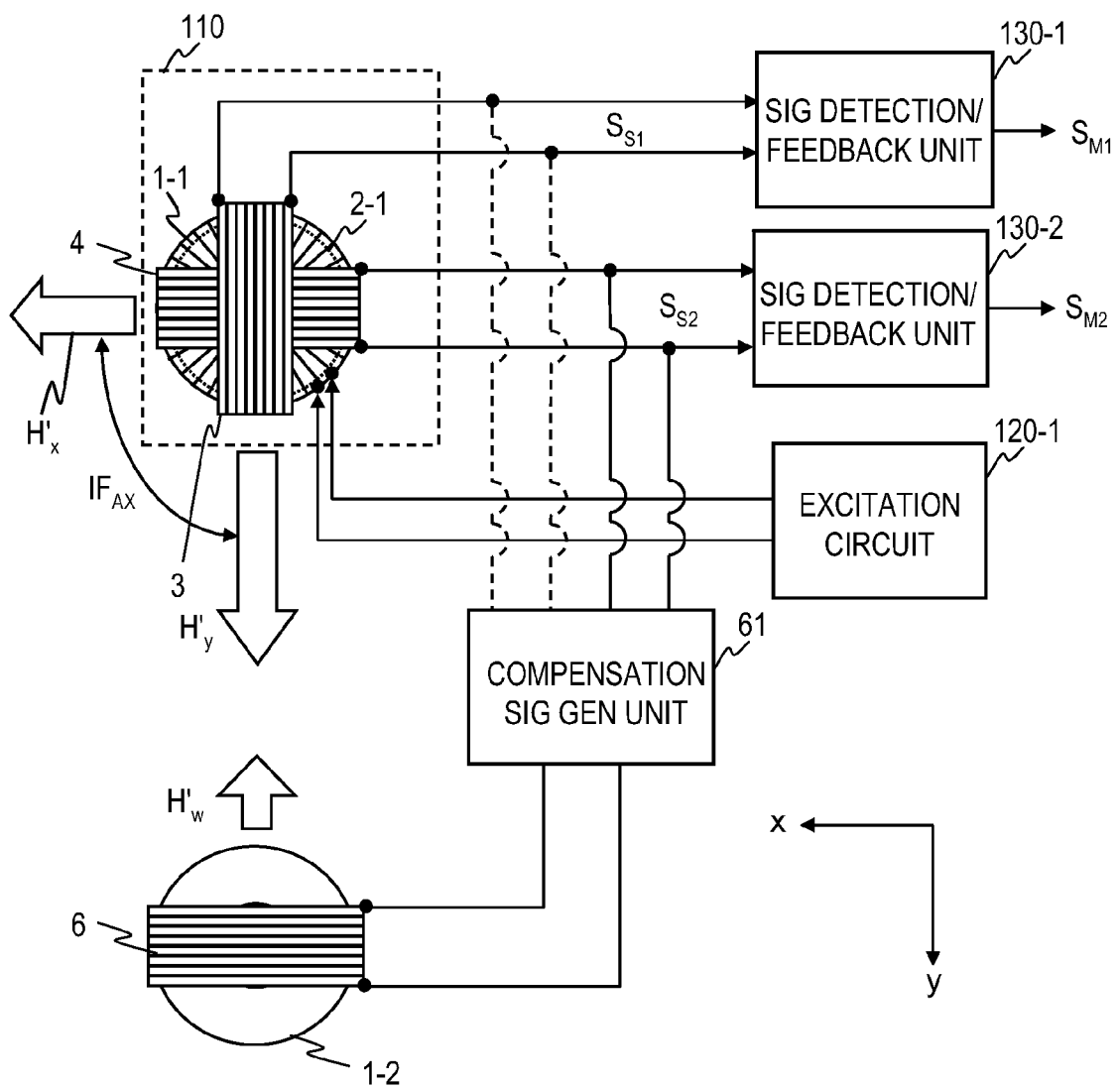
FIG. 15 is a diagram illustrating an example configuration where there are two detection coil input axes and ring-shaped magnetic cores 1-1 and 1-2 are arranged on a same plane.

For example, FIG. 15 illustrates an example in which two detection coil input axes are provided, ring-shaped magnetic cores 1-1 and 1-2 are arranged on a same plane, and an input axis of a compensation coil 6 is arranged so as to be orthogonal to an input axis of a first detection coil 3, and in a direction opposite to an input axis of a second detection coil 4.

Furthermore, if the ring-shaped magnetic core 1-2 does not double as a ring-shaped magnetic core for a detection coil, the shape of the ring-shaped magnetic core 1-2 on which a compensation coil is wound may be another shape such as a stick shape. Furthermore, a material for the ring-shaped magnetic core 1-2 may be different from that of the ring-shaped magnetic core 1-1.

Although the compensation signal generation unit 61 in the present embodiment generates a compensation current to be applied to the compensation coil 6 from an output of the second detection coil 4, the compensation signal generation unit 61 may generate a compensation current to be applied to the compensation coil 6 from outputs of both of the first detection coil 3 and the second detection coil 4.

Figure 11:
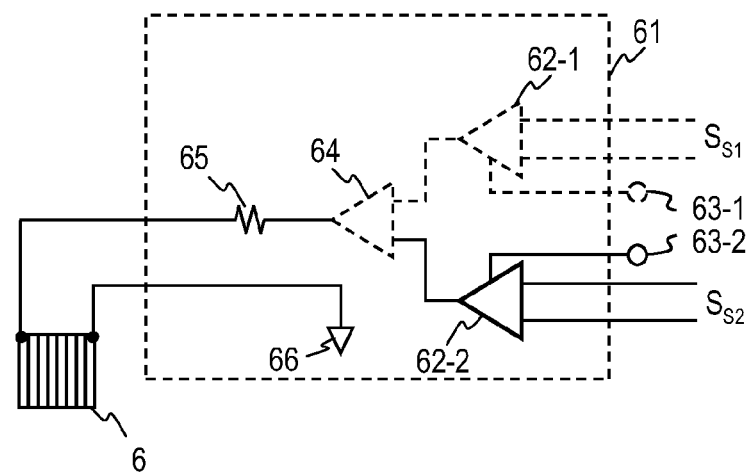
FIG. 11 is a diagram illustrating an example configuration of a compensation signal generation unit 61.

A description will be given with reference to FIG. 11. The compensation signal generation unit 61 includes buffer amplifiers 62-1 and 62-2, an adder circuit 64 and a resistor 65. An output of the first detection coil 3 is input to the buffer amplifier 62-1, and an output of the second detection coil 4 is input to the buffer amplifier 62-2. A gain of the buffer amplifier 62-1 is set by means of a gain adjustment terminal 63-1, and a gain of the buffer amplifier 62-2 is set by means of a gain adjustment terminal 63-2. Outputs of the buffer amplifiers 62-1 and 62-2 are input to the adder circuit 64, and the adder circuit 64 adds up the outputs and outputs the result of the addition. An end of the compensation coil 6 is connected to the adder circuit 64 via the resistor 65, and the other end is connected to a signal ground 66. Upon an output of the adder circuit 64 being applied to the compensation coil 6, the compensation coil 6 creates a compensation magnetic field.

Figure 16:
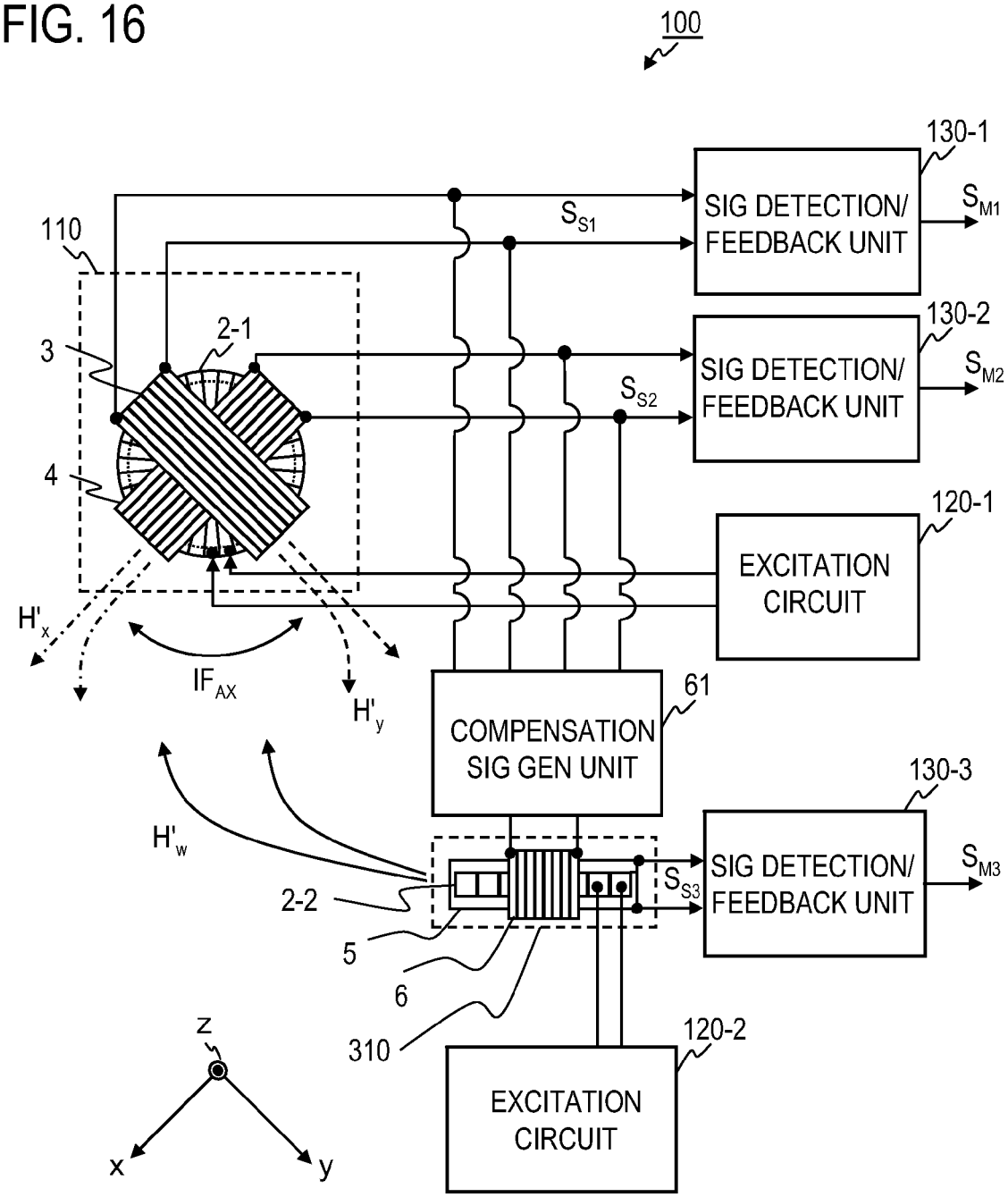
FIG. 16 is a diagram illustrating a method for adjusting a compensation magnetic field based on outputs from two detection coils.

For example, with such a configuration as illustrated in FIG. 16, an optimum value for a compensation magnetic field will be calculated as described below. While applying temperatures and generating a compensation magnetic field using outputs of the first detection coil 3 and the second detection coil 4, changes in the magnetic sensor sensitivity of the first detection coil 3 are monitored, and the gains of the buffer amplifiers 62-1 and 62-2, the distance and/or positional relationship between, and/or the directions of, detection coils (for example, the second detection coil 4) creating feedback magnetic fields to be balanced out, and the compensation coil 6, and/or the number of turns of the compensation coil 6 are adjusted so that the non-linearity of the temperature characteristic curve becomes minimum.

In FIG. 16, the angle between the input axis of the first detection coil 3 and the input axis of the compensation coil 6 is 45°, and the angle between the input axis of the second detection coil 4 and the input axis of the compensation coil 6 is 135°. The compensation magnetic field $H'_w$ created by the compensation coil 6 affects both of the first feedback magnetic fields $H'_x$ and $H'_y$ and balances out interference $IF_{AX}$ between magnetic fields of the two orthogonal axes. Since the amount of interference $IF_{AX}$ between magnetic fields of the two orthogonal axes is estimated from two axis feedback currents generating orthogonal feedback magnetic fields, the interference $IF_{AX}$ can be balanced out more accurately, enabling more accurate sensing.

Although one compensation coil is provided in the present embodiment, the present invention may also be configured in such a manner that two compensation coils and two compensation signal generation units are provided so as to correspond to two detection coils, respectively, and each compensation signal generation unit generates a compensation current to be applied to the corresponding compensation coil, from an output of the corresponding detection coil, thereby balancing out an interfering magnetic field from among the respective feedback magnetic fields to cancel interference between the two orthogonal axes.

What is claimed is:

1. A multi-axis fluxgate magnetic sensor comprising:
a first magnetic core of a ring shape;
a first excitation coil wound on the first magnetic core;
first and second detection coils wound on the first ring-shaped magnetic core in such a manner that respective input axes of the first and second detection coils are orthogonal to each other;
first and second signal detection/feedback units that are configured to detect outputs of the first and second detection coils, respectively, and provide feedback currents corresponding to output signals therefrom to the first and second detection coils, respectively;
a first excitation circuit that is configured to supply an excitation current to the first excitation coil;
a second magnetic core;
a compensation coil wound on the second magnetic core; and
a compensation signal generation unit that is configured to generate a compensation current to be applied to the compensation coil by adding the outputs of the first and second detection coils;
wherein the second magnetic core and the compensation coil are disposed so that a compensation magnetic field created by the compensation coil cancels interference between feedback magnetic fields produced by the feedback currents provided to the first and second detection coils wound on the first magnetic core.

2. The multi-axis fluxgate magnetic sensor according to claim 1, wherein
the second magnetic core has a ring shape; and
the multi-axis fluxgate magnetic sensor further includes:
a second excitation coil wound on the second magnetic core;
a third detection coil wound on the second magnetic core;
a third signal detection/feedback unit configured to detect an output of the third detection coil and to feed an output signal therefrom back to the third detection coil; and
a second excitation circuit configured to supply an excitation current to the second excitation coil;
wherein respective input axes of the compensation coil and the third detection coil are orthogonal to each other.

3. The multi-axis fluxgate magnetic sensor according to claim 2,
wherein the first magnetic core and the second magnetic core both have an identical configuration;
wherein the first excitation coil and the second excitation coil both have an identical configuration; and
wherein the first and second detection coils wound on the first magnetic core and the third detection coil wound on the second magnetic core all have an identical configuration.

4. The multi-axis fluxgate magnetic sensor according to any one of claims 1 to 3, wherein the input axis of the third detection coil is disposed so as to be orthogonal to the respective input axes of the first and second detection coils wound on the first magnetic core.

* * * * *